United States Patent [19]
Boyd

[11] Patent Number: 5,511,608
[45] Date of Patent: Apr. 30, 1996

[54] CLAMPLESS VACUUM HEAT TRANSFER STATION

[76] Inventor: Trace L. Boyd, 1300 La Terrace Cir., San Jose, Calif. 94304-1030

[21] Appl. No.: 368,567

[22] Filed: Jan. 4, 1995

[51] Int. Cl.⁶ .................................................. F28F 7/00
[52] U.S. Cl. .............................. 165/80.1; 118/724
[58] Field of Search ................... 165/1, 80.1, 80.5; 118/724, 725, 728

[56] References Cited

U.S. PATENT DOCUMENTS

| | | | |
|---|---|---|---|
| 3,895,967 | 7/1975 | Anthony | 148/1.5 |
| 4,457,359 | 7/1984 | Holden | 165/80.5 |
| 4,909,314 | 3/1990 | Lamont, Jr. | 165/80.3 |
| 5,181,556 | 1/1993 | Hughes | 165/80.1 |
| 5,287,914 | 2/1994 | Hughes | 165/80.1 |

*Primary Examiner*—Allen J. Flanigan
*Attorney, Agent, or Firm*—Gerald M. Fisher

[57] ABSTRACT

A clampless heat exchange station for a semiconductor wafer for use in a vacuum chamber, at pressures from 2 Torr to 30 Torr using commercial grade inert gas. The heat exchange chuck has apertures therethrough in the region where the wafer is to be mounted to serve as a miniature plenum gas to provide equal pressure along the bottom and top sides of the wafer. This configuration avoids chipping and particle deposition and provides improved heat transfer rate and wafer temperature uniformity.

11 Claims, 3 Drawing Sheets

CLAMPLESS VACUUM HEAT TRANSFER STATION

FIELD OF THE INVENTION

Vacuum processing of semiconductive wafers, and more particularly thermal processing, i.e., heating or cooling of said wafers in a vacuum environment.

BACKGROUND OF THE INVENTION

Heating and cooling of a semiconductor wafer in a vacuum environment is a frequent requirement in conjunction with many processes in the manufacture of integrated circuit devices. Because of the ultra stringent requirement for cleanliness during these processes, to avoid introduction of impurities and deposition of particles on the wafer, it has become increasingly essential for advanced integrated circuit manufacture that almost all of these heat transfer operations be carried out in an evacuated chamber. Conventionally, heat transfer mechanisms between a wafer an its environment would involve radiation, conduction at points of contact between the wafer and its support and conduction through the gases between the wafer and the support. Radiation is a very small contributor in the temperature range of concern. Moreover, transfer of heat at vacuum pressures is a complicated phenomenon which is highly dependent on the vacuum pressure employed.

Accordingly, in the prior art, various approaches have been used to increase the heat transfer rate in a vacuum between the wafer and its supporting chuck. Applications of large clamping pressures to increase contact heat conductance has been employed successfully, but it necessarily requires contacting the edge of the wafer. This always results in the formation of particles and of in chipping of the wafer edges. Also, most often, a soft, heat conductive material is employed between the chuck and the wafer to improve the area of actual surface contact. This soft material has tended to stick to the wafer and cause wafer handling and transfer complications.

The most common cooling approach in use in the semiconductor industry at this time is called "backside" cooling and it employs edge clamping of the wafer to a chuck and to apply an increased gas pressure only to the underside of the wafer so that the heating/cooling which gas molecules bounce back and forth between the wafer and the chuck and transfer heat to the colder member. The configuration most generally employs the wafer as a membrane which excludes the somewhat higher pressure heat transfer gases from getting into the lower vacuum pressure evacuated chamber. This structure has been necessary to maintain the cleanliness of the low pressure face of the wafer upon which the processes such as deposition, etch and implantation are carried out.

It was understood in the prior art "backside cooling" that it was beneficial to maintain the gap between the wafer and chuck as small as possible to improve gas molecule frequency of impact. However, the higher back face gas pressure causes the wafer to dome and this causes the gap spacing to have different dimensions across the wafer diameter. To compensate for this problem, the chuck surfaces have been made dome shaped. Also, the backside pressure cannot be much higher than 10 Torr above the vacuum chamber pressure or the wafer will fracture. At the maximum back pressures which have been restricted to approximately 10 Torr or less, the heat transfer rates are highly pressure sensitive. Accordingly, due to local differences in gap spacing between the wafer and the support and the pressure dependency there are spatial variations in the heat transfer rates across the wafer. This has caused a temperature non-uniformity across the wafer.

The Anthony et al., U.S. Pat. No. 3,895,967, discloses an apparatus that bears some superficial similarity to the instant invention. Specifically, backside wafer heating is accomplished in a vacuum chamber by gas conductive heating between the heater plate and the wafer across a large gap. A critical distinction is that Anthony is configured to use a pressure of one (1) atmosphere. At one atmosphere pressure, employing commercially available He, as taught by Anthony, the concentration of the impurities introduced by the He are so high as to make the process impractical because the impurities diffuse into the wafer. Anthony employs the higher pressure regime for the improved heat transfer rate. In this one atmosphere pressure range, since the gas heat transfer is insensitive to pressure variations, the effect of the large gap between the wafer and the plate as used by Anthony is acceptable.

OBJECTS OF THE INVENTION

It is an object of this invention to provide a vacuum process having a high rate heat transfer apparatus and method which allows use of pressures above 10 Torr but below 30 Torr without risk of wafer fracture.

It is a still further object of this invention to eliminate clamping contact to the wafer to eliminate formation/transfer of particles to the wafer or edge chipping of the wafer.

DETAILED DESCRIPTION OF THE INVENTION

During heat treating of a semiconductor wafer in a vacuum chamber, it is known that thermal conduction between two separated and parallel plates depends on the pressure of the interplate gas and the distance between the plates. At high pressures, most gas molecules collide with other gas molecules since the mean free path is small. This is the so called viscous region and in this region the rate of heat transfer is generally understood to be independent of pressure. At the other extreme, is the so called "free molecule region", which most of the gas molecules collide first with the wafer and the support plate. However, at these lower pressures, the rate of heat transfer is lower because there are fewer molecular carriers. In this regime, the heat transfer rate is highly pressure dependent. Because of the wafer clamping and wafer bowing problems the so called "backside" heat transfer mechanisms have necessarily been restricted to the lower pressure region in which the heat transfer rate is substantially pressure sensitive. This has resulted both in macro differences in heat transfer rate and in wafer temperature non-uniformity during heating or cooling using backside gas heat exchange techniques.

The current invention has overcome these problems by providing wafer degassing apparatus which is not restricted to operation in the pressure region below 10 Torr backside pressure. This is made possible by providing the same pressure gas on both sides of the wafer. This configuration permits operation at any pressure. However, at pressure higher than 30 Torr, trace impurities in the gases can become a serious problem. At higher pressures, the impurity concentration results in impurity diffusion during heat transfer operation. Further, there is no benefit to use pressure any higher than about 30 Torr since the heat transfer rate does not significantly increase in the viscous regime.

The apparatus of this invention employs only gravity for clamping and does not employ a clamp for increasing the transfer plate direct contact pressure. Also, the configuration intentionally eliminates any fixed gap in the back space between the wafer and the heat transfer plate. Machining the heat transfer plate to good flatness in a region large enough to receive the wafer improves the heat transfer by increasing the molecular bounce rate. good results can be achieved with heat transfer plate flatness of 0.010 inches although 0.005 inches is preferred. This flat region cooperates with the backside surface of a wafer which has a roughness less than 12.5 micro inches.

Figure 1:
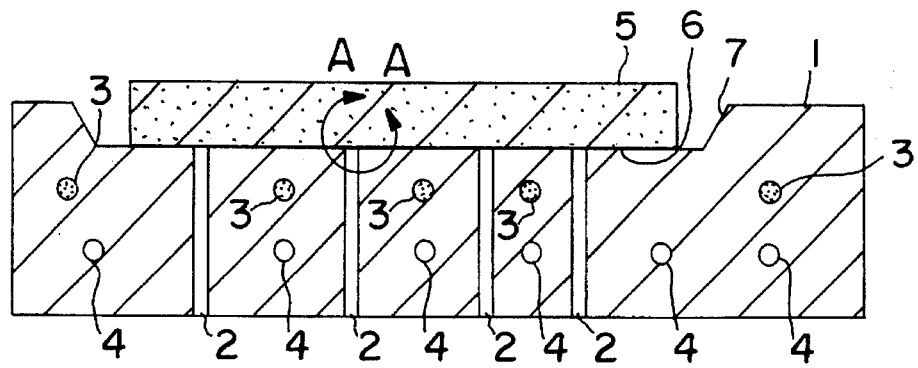
FIG. 1 is a schematic cross-section of a wafer and a chuck employed in the invention.
Figure 2:
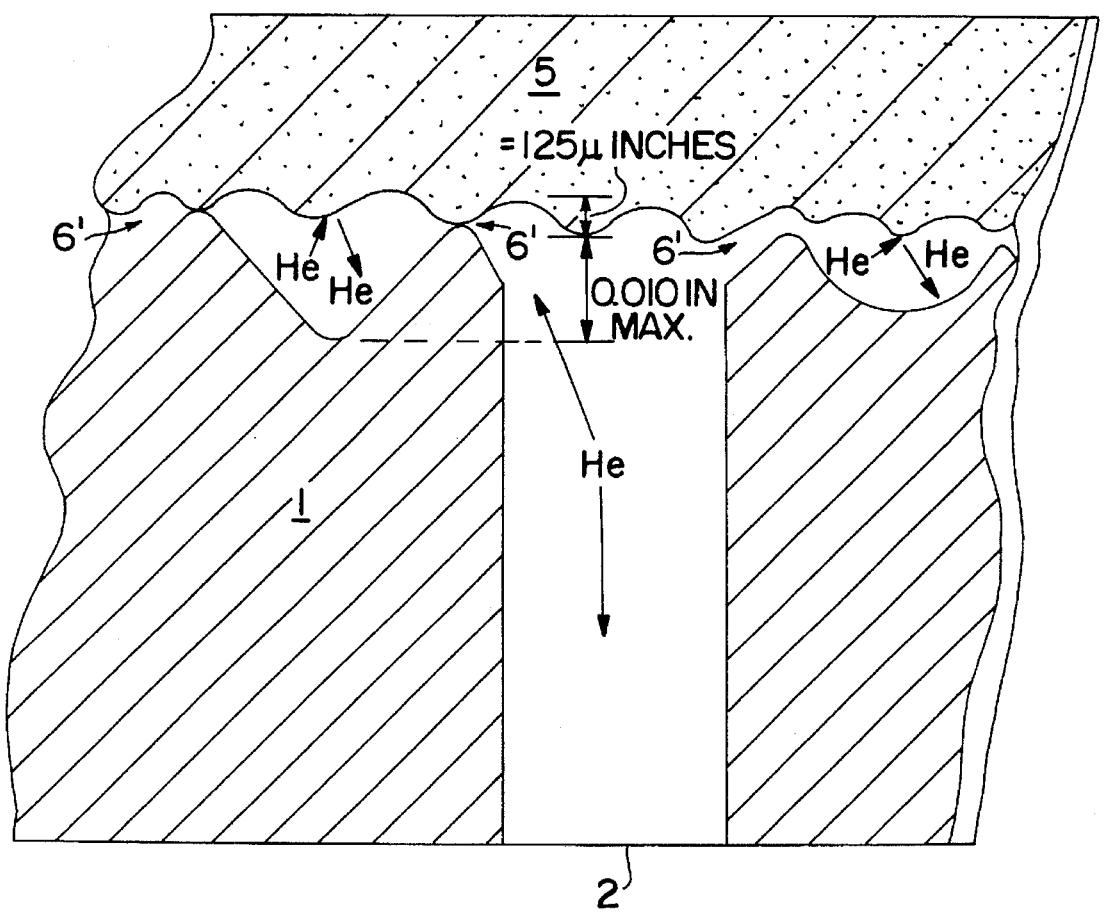
FIG. 2 is a cross-section of region A—A, FIG. 1 to illustrate the microscopic surface roughness of the backside of the wafer and of the top surface of the chuck to illustrate the heat transfer mechanism in the region between these surfaces.

With particular reference to FIG. 1, the semiconductive wafer 5 to be treated is placed into a recess 7 in the surface of the heat transfer plate 1 for retaining the wafer from horizontal movement. The wafer rests on the surface 6 of the heat transfer plate 1 and no clips or other means are employed to increase the compressive force between the wafer and the heat transfer plate 1 beyond the weight of the wafer 5. The heat transfer plate could alternatively have raised tabs 7' FIG. 4A, to retain horizontal wafer movement. A plurality of drilled holes 2 of close tolerance diameter are placed, preferably equally spaced, through the heat transfer plate 1 into the wafer bearing region to provide a gas plenum to provide equal gas pressure across both upper and lower surfaces of the wafer 5. As seen in FIG. 2, on a microscopic scale, the gas may enter holes 2 and flow throughout the contact region 6' in free exchange with the gas entering the region 6' from the wafer edge region near recess 7. The heat transfer plate functions as a heater plate by being heated from nichrome wound wire(s)3 embedded in or fixed to backside of the plate or the plate could be made from resistive thermal materials such as graphite. Holes 2 are preferably selected to be a fixed diameter for a plate and are preferably in the diameter range 1/16 inch to 1/8 inch. Since argon or He will readily move through very small diameter holes, these hole diameters could be very much smaller without degradation of the initial flow.

The plate could alternatively be a cooling station by including conduit channels 4 for containing a flow of refrigerant gas or liquid coolant to an external pump and heat exchanger. Alternatively, the heat transfer plate could contain both heater and cooler capabilities and serve both a dual function as well as to simultaneously flow refrigerant and apply heat for more rapid temperature correction.

Figure 3:
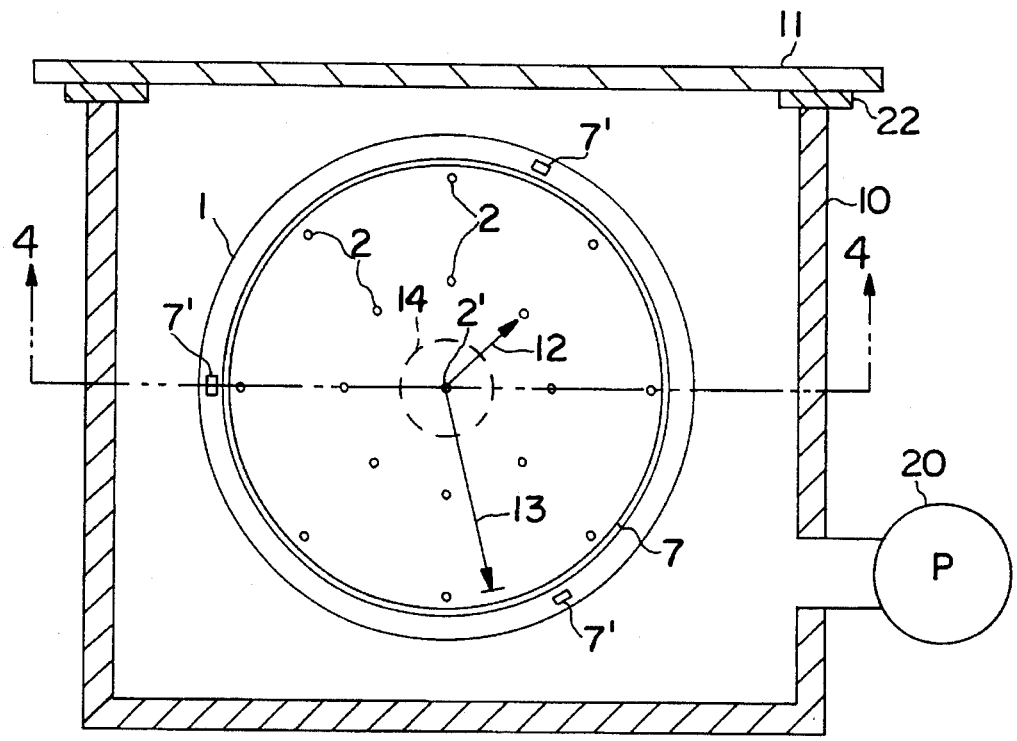
FIG. 3 is a top view of an embodiment of a heat transfer chamber and chuck of the present invention.
Figure 4:
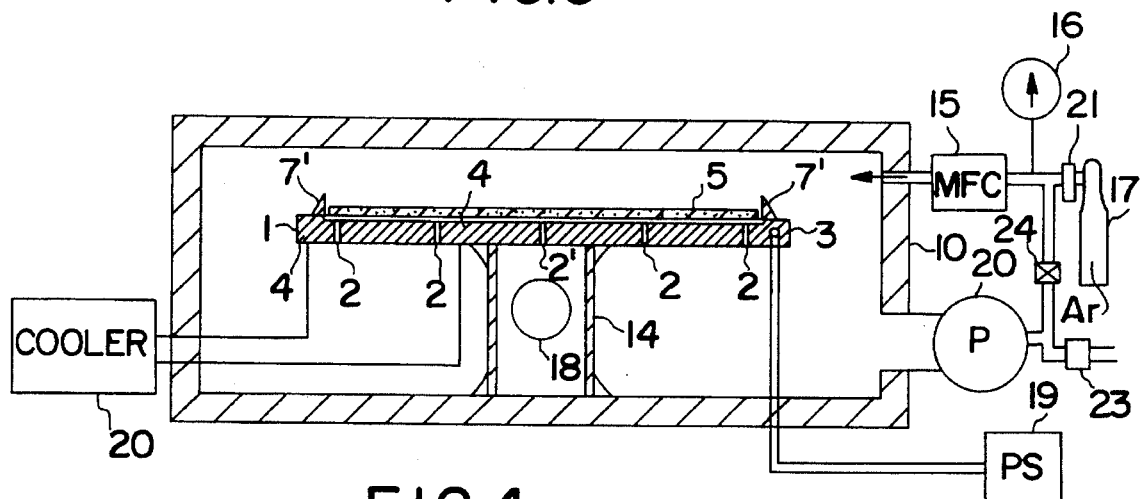
FIG. 4 is side view the chamber and chuck of the invention.
Figure 5A:
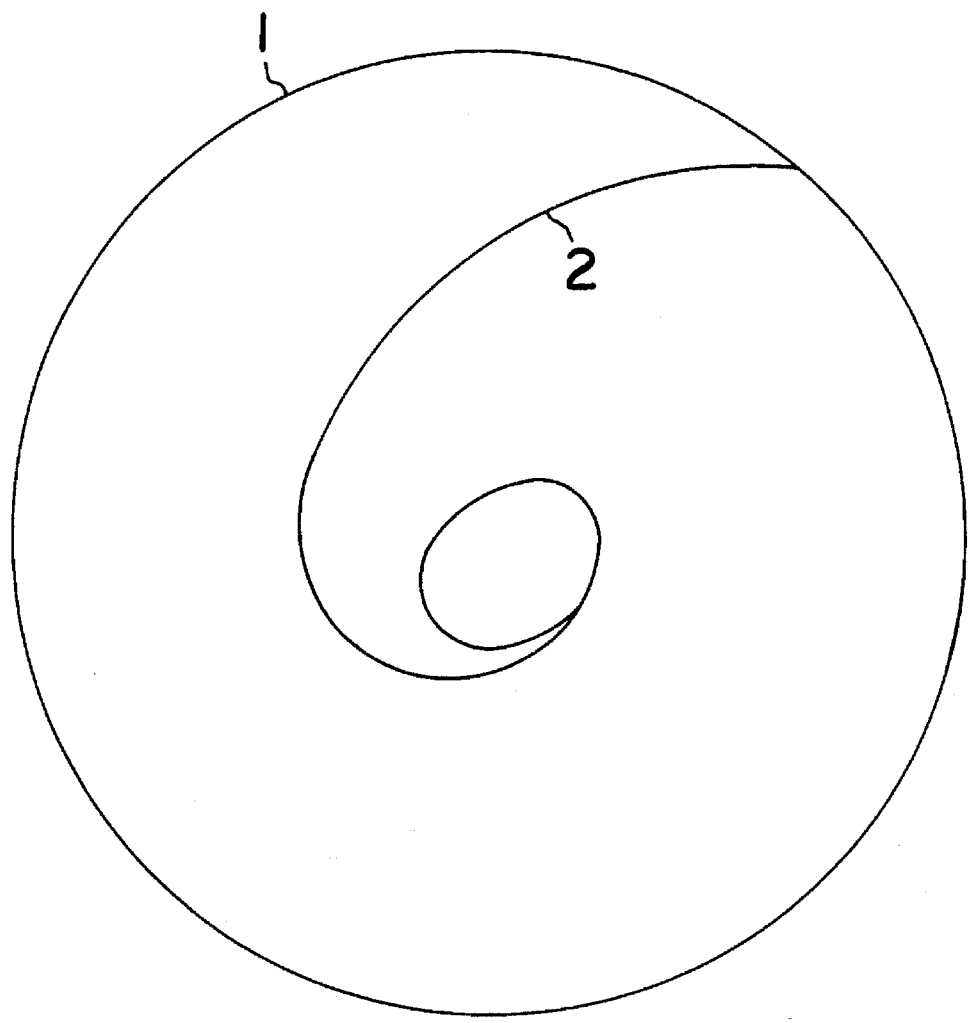
FIG. 5A is a top view of an alternate heat transfer place.
Figure 5B:
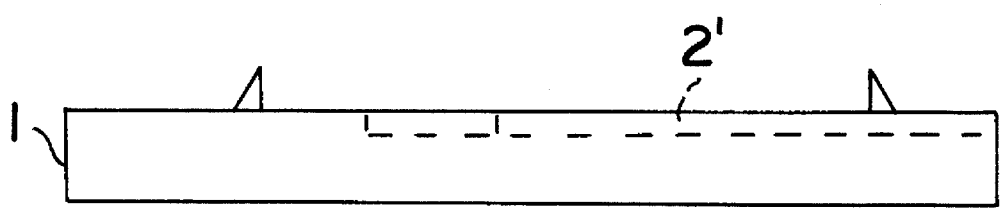
FIG. 5B is a side view of the alternate of FIG. 5A.

More specifically, heat transfer plate holes 2 are illustrated in FIG. 3 as being placed on spaced radial lines at a first radius 12 and second radius 13 and at the center 2' of the circular recess in the heat transfer plate 1. The miniature plenum hole configuration is not critical but the holes should be more or less equally spaced especially when helium is the gas used since the He molecule is so very small. For most common interface surfaces, both Argon and He will exhibit almost free flow characteristics in the microscopic interstices in the region 6'. A transfer plate support tube 14 is employed to support the transfer plate 1 above the bottom wall of the vacuum chamber wall 10. A hole 18 is provided in side wall of the tube 14 to provide free gas flow to the central aperture 2' of the heat transfer plate as seen in FIG. 4.

It is important for achieving the high heat transfer rate that is achieved with my invention that the apparatus maximizes the solid surface area of the heat transfer plate in the planar heat transfer top surface region of the plate which is directly opposite the backside area of the wafer. This is to provide the maximum of solid material for interaction with the inert gas molecules in the interface region. This requirement necessarily implies that the area of the planar heat transfer top surface region which is part of the vent must be minimized to a value which is just sufficient to permit rapid pressure equalization on both surfaces of the heat transfer plate. We believe that this can be accomplished if $$\sum_{1}^{n} \frac{A_n}{A} << 0.1$$

where $A_n$ is the cross section area of a hole and A is the total wafer diameter and where N is the number of holes or vent area in the heat transfer plate.

Gas is provided to the evacuated chamber 10 through valve 21 and through a mass flow controller 15 from an Argon gas source 17. Transfer of the wafer to and from the chamber is through a chamber door 11 which seals against surface 22. The vacuum pump 20 is connected to the chamber 10 for maintaining the required low base pressure in the chamber. Alternatively, the vacuum pump can be recycled through valve 24 but generally valve 24 is closed and valve 23 is open to exhaust the pump to a vacuum roughing pump so that roughing pump oil impurities do not get to the chamber 10.

Wafer heating tests performed with the invention in a heater embodiment disclosed a significantly improved heat transfer rate as compared to prior art. The prior art peak rate of temperature rise was 7.5° C./sec. as compared to 12° C./sec. for the instant invention.

Even more indicative of the improvement of my invention is that in my invention the temperature difference between the transfer plate 1 and the wafer has been reduced by a factor of 4. Specifically, for a 550° C. plate. in the prior art, the wafer reached a steady state temperature of 440° C., for a 110° C. difference. In the instant invention, the temperature difference is 25° C. for the same 550° C plate.

Additionally, with no clamping, the steady state temperature uniformity across a six inch wafer improved from ±3% to ±1.5%.

Although the present invention is described herein in reference to the embodiments of the drawings, it is understood that these are illustrative embodiments and that the instant invention is not restricted to these embodiments but the scope of the invention is intended to be determined by the attached claims.

With this in view, what is claimed is:

1. A thermal transfer apparatus for exchanging heat with a first surface broad face area W of a semiconductor wafer comprising:

(a) a vacuum chamber, said vacuum chamber including a base and enclosing walls having a door opening and a gate means for permitting introduction into and removal of said semiconductor wafer from said vacuum chamber, said gate means including means to vacuum seal said gate means to said door opening when said gate means is forced against said door opening, said vacuum chamber further including means to pump down the pressure in said chamber to vacuum pressures;

(b) a heat transfer plate, said heat transfer plate being mounted in said vacuum chamber, said heat transfer plate having first and second opposed surfaces, said heat transfer plate first surface having a planar region of area A for receiving and supporting said first surface of said semiconductor wafer, said planar region being flat within 0.010 inches, said area A being larger than said area W of said semiconductor wafer, said planar region for receiving and supporting said semiconductor wafer having a vent means therein, said vent means being a passage so that gases in said vacuum chamber are able to freely diffuse through said vent so that gases near said first and second opposed surfaces of said heat transfer plate are in free laminar gas communication at all times including those times when said semiconductive wafer is placed in said planar region for receiving and supporting said first surface of said semiconductive wafer;

(c) a source of inert gas pressure, conduit means connected to said source of inert gas pressure and to said vacuum chamber to provide a metered flow of said inert gas to said vacuum chamber to provide a chamber pressure P, where P>2 Torr; and (d) means connected to said heat transfer plate to provide heat energy to raise the temperature or to extract heat energy to lower the temperature of said wafer.

2. The apparatus of claim 1 wherein said vent means of said planar region of said first surface of said heat transfer plate is N distributed holes, each said hole having a cross sectional area $A_n$ where N is an integer equal to or greater than 1 and further where the ratio of $$\sum_{1}^{n} \frac{A_n}{A} << 0.1.$$

3. The apparatus of claim 2 wherein said heat transfer plate region for receiving said first surface of said semiconductive wafer includes a lateral motion retainer at said first surface of said heat transfer plate.

4. The apparatus of claim 3 wherein said lateral motion retainer is a bevel around the edge of said planar region extending above said planar region.

5. The apparatus of claim 3 wherein said lateral motion retainer is a plurality of tabs extending above said planar region.

6. The apparatus of claim 2 wherein said N equals 1.

7. The apparatus of claim 1 wherein said heat transfer plate is supported from said vacuum chamber base by a support means attached to said second surface of said heat transfer plate.

8. The apparatus of claim 2 wherein said heat transfer plate includes a source of heat, said source of heat comprising a nichrome wound wire heating coil.

9. The apparatus of claim 7 wherein said heat transfer plate includes cooling channels, said cooling channels being conduits for receiving a flowing liquid cooling fluid.

10. In a vacuum chamber, a method for exchanging thermal energy between a heat transfer plate having a top surface and bottom surface and a semiconductor wafer having a broad top and bottom surface, where said bottom surface of said wafer has a roughness on the order of 125 micro inches comprising:

providing said top surface of said heat transfer plate with a planar machined surface region which is flat to within 0.010 inches, and further providing said planar region with a vent allowing free gas communication through said vent between the volume bordering said bottom and said top surfaces of said heat transfer plate;

without external clamping forces, placing said bottom surface of said semiconductor wafer directly upon said planar machined surface region of said heat transfer plate having said vent so that there is no gap therebetween other than the backside roughness interstices so that the region between said semiconductor wafer and said machine surface remains in gas communication with said bottom surface of said heat transfer plate even when said semiconductor wafer is placed upon said planar region on said heat transfer plate top surface;

pressuring said vacuum chamber with an inert gas at a pressure P where 30 Torr>P>2 Torr;

transferring heat from said heat transfer plate to or from said semiconductive wafer by collisions of said gas molecules of said inert gas with said semiconductive wafer and said heat transfer plate in said contact region.

11. In a vacuum chamber, a method for exchanging thermal energy between a heat transfer plate having a top and bottom surface and a semiconductive wafer having a broad area top and bottom in a vacuum chamber comprising:

providing said heat transfer plate with a region having a plurality of discrete controlled diameter apertures which pass through said heat transfer plate allowing gas communication through said apertures from said bottom to top surface of said heat transfer plate;

placing said semiconductor wafer bottom directly upon said top surface of said heat transfer plate in said aperture region of said heat transfer plate without any gap therebetween other than roughness interticesand without external clamping forces therebetween other than the weight of said semiconductive wafer, thereby providing a contact region between said semiconductive wafer and said aperture surface which is in free gas communication with said chamber interior;

pressuring said vacuum chamber with an inert gas at a pressure P where 30 Torr>P>2 Torr; and cooling said heat treating plate by flowing a cooling fluid in conduits embedded in said heat treating plate; and cooling said semiconductor wafer by transferring heat from said semiconductor wafer to said heat transfer plate by collisions of said gas molecules with said semiconductor wafer and said heat transfer plate in said contact region.

* * * * *